United States Patent [19]
Peters

[11] 3,959,669
[45] May 25, 1976

[54] CONTROL APPARATUS FOR SUPPLYING OPERATING POTENTIALS

[75] Inventor: Edwin F. Peters, Maumee, Ohio

[73] Assignee: Owens-Illinois, Inc., Toledo, Ohio

[22] Filed: Dec. 8, 1972

[21] Appl. No.: 313,480

[52] U.S. Cl. .............................. 307/262; 307/255; 307/282; 307/300; 307/270; 315/169 R
[51] Int. Cl.² ...................... H03K 1/12; H03K 3/30
[58] Field of Search .......... 307/254, 255, 260, 262, 307/263, 268, 270, 282, 300; 328/67; 315/169 R

[56] References Cited
UNITED STATES PATENTS

| | | | |
|---|---|---|---|
| 3,194,979 | 7/1965 | Toy ..................................... | 307/254 |
| 3,417,266 | 12/1968 | Webb .................................. | 307/263 |
| 3,492,503 | 1/1970 | Bose ................................... | 307/254 |
| 3,539,832 | 10/1970 | Jones, J r. et al. ..................... | 328/67 |
| 3,546,487 | 12/1970 | Espinal ............................... | 307/270 |
| 3,639,784 | 2/1972 | Kelleher, Jr. ........................ | 307/260 |
| 3,683,208 | 8/1972 | Burens ................................ | 307/254 |
| 3,706,892 | 12/1972 | O'Brien ............................... | 307/300 |
| 3,728,558 | 4/1973 | Genuit et al. ........................ | 307/262 |

Primary Examiner—Stanley D. Miller, Jr.
Attorney, Agent, or Firm—Donald Keith Wedding

[57] ABSTRACT

There is disclosed a system for supplying operating potentials which is particularly useful with load devices wherein at least two transversely oriented conductors are dielectrically isolated from a gaseous discharge medium between the conductors. The system utilizes wave form generators, each having at least one output transistor. Novel transformer-diode clamping means are provided to reverse bias the collector-base junctions of the output transistors, novel capacitive driving means are used for the transistors, and the control of the transistors with respect to each other is coordinated to provide a system which produces a more effective wave form, the wave form in the embodiment shown being used as a sustaining voltage for cells in a gas discharge display/memory panel.

12 Claims, 6 Drawing Figures

CONTROL APPARATUS FOR SUPPLYING OPERATING POTENTIALS

BACKGROUND OF THE INVENTION

In the Baker, et al. U.S. Pat. No. 3,499,167, issued Mar. 3, 1970, there is disclosed a multiple discharge display and/or memory panel which may be characterized as being of the pulsing discharge type having a gaseous medium, usually a mixture of two gases at a relatively high gas pressure, in a thin gas chamber or space between opposed dielectric charge storage members which are backed by conductor arrays. The conductor arrays backing each dielectric member are transversely oriented to define or locate a plurality of discrete discharge volumes or sites and constitute a discrete discharge unit. In some cases, the discharge units may be additionally defined by physical structures such as perforated glass plates and the like and in other cases capillary tubes and like structures may be used. In the above-identified patent application of Baker, et al., physical barriers and isolation members for discrete discharge sites have been eliminated. In such devices charges (electrons and ions) produced upon ionization of the gas at a selected discharge site or conductor crosspoint, when proper operating potentials are applied to selected conductors thereof, are stored upon the surfaces of the dielectric at the selected locations or sites and constitute an electrical field opposing the electrical field which created them. After a firing potential has been applied to initiate a discharge, the electrical field created by the charges stored upon the dielectric members aids in initiating subsequent momentary or pulsing discharges on succeeding half cycles of an applied sustaining potential so that the applied potential, and hence the storage charges indicate the previous discharge condition of a discharge unit or site and can constitute an electrical memory.

In dynamic operation, in addition to the sustaining voltages, writing and erasing pulses may be superimposed on and algebraically added to the sustaining wave forms applied to selected transverse conductor pairs in the conductor arrays to manipulate discharge conditions of discharge sites. Some of the preferred types of circuits for supplying the sustaining potentials, and for generating the manipulating pulses to be added to the sustaining potentials, utilize output transistors which are driven into deep saturation to abruptly switch the wave form from one potential level to another. Difficulties have been encountered in the past, in that when a transistor is turned "on" and driven into deep saturation, it is difficult to bring the transistor out of saturation and turn it "off" quickly. This makes control of the shape of the trailing edge of the wave form difficult, may interfere with the addition of manipulating pulses, etc. and is undesirable. Diode clamping circuits have been proposed and are useful in certain applications for bringing the transistor out of saturation within the time limits of those systems. However, as the switching speeds increase and as the type of wave forms applied as sustaining potentials and as manipulating pulses become more complex, the diode clamping circuit is not suitable for all applications.

Accordingly, it is an object of this invention to provide an improved system for supplying operating potentials to load devices, particularly wherein the load devices are of the gas discharge display/memory type.

It is another object of this invention to provide improved voltage wave form generating means which includes at least two sections, each of the sections having an output transistor to connect first and second potential levels to the load device. The turn "on" and turn "off" of the output transistors is coordinated so that a turn-off signal for one section will overlap in time a turn-on signal for the other section, to prevent current spiking of the output transistor means being turned "off".

It is a further object of this invention to provide improved control apparatus for transistors in which novel transformer-diode clamping circuits may be utilized to bring the transistor out of saturation and permit the transistor to be turned "off" more quickly. In addition, novel means are shown for driving the transistors into saturation more quickly.

SUMMARY OF THE INVENTION

The invention is disclosed and described herein in a system for supplying operating potentials to a gas discharge display/memory device of the type described hereinbefore. A wave form generating means is shown which includes at least two sections, a first of the sections being operative to connect a first potential level to the output of the generator, while a second of the sections is operative to connect a second potential level to the output, the output being connected to conductors in the array of the gas discharge device, either directly or thru line to line isolation elements, such as diodes.

Each of the output sections includes at least one output transistor means operating as a switching means between its respective potential level and the output of the wave form generating means. Each of the transistors has a collector, base and emitter electrode and a collector-base and emitter-base junction.

Means are provided for selectively applying turn-on signals to the base electrodes of each of the output transistor means, the signals being sufficient in magnitude to drive each of the output transistors into saturation. Means are also provided for selectively applying turn-off signals to each of the output transistor means. Means responsive to the turn-off signals selectively establishes current flow through the collector-base junctions of each of the output transistors to reverse bias the collector-base junction to bring the transistors out of saturation and enable each of the output transistors to turn "off" quickly.

The application of the turn-off and turn-on signals is coordinated so that a turn-off signal for one section will overlap in time a turn-on signal for the other section to prevent current spiking of the output transistor means being turned "off".

The reverse bias establishing means for the output transistors includes a transformer having primary and secondary windings, an isolating rectifier means, and means for connecting a reverse bias source to the primary winding of the transformer. There are two embodiments of the reverse bias establishing means disclosed herein, each useful in a particular application. The reverse bias establishing means may be generically described as having at least one of the primary and secondary windings connected in a circuit across the collector-base junction of the output transistor with the isolating rectifier means. The isolating rectifier means is connected to prevent current flow between a collector electrode and a base electrode of the transistor through windings of the transformer in response to collector potentials that would establish a forward bias across the emitter-base junction.

The primary winding of the transformer is generically described as being connected to receive current from a reverse bias source which will induce a potential on the secondary winding which will cause current flow through the isolating rectifier in a forward direction and through the collector-base junction in a direction to reverse bias the collector-base junction and discharge the minority carriers from the saturated junction to enable the transistor to turn "off" quickly.

Specifically, a first embodiment of the reverse bias establishing means illustrated herein has the secondary winding connected between the collector and base electrodes of the output transistor via the isolating rectifier means, which is connected to prevent current flow in the secondary winding from the collector electrode to the base electrode. Current flow in the primary winding from the reverse bias source will induce a voltage on the secondary winding which will reverse bias the collector-base junction.

Specifically, a second embodiment of the reverse bias establishing means disclosed herein has the primary winding connected between the side of a reverse bias source connecting means opposite from the source itself, through the isolating rectifier to the collector electrode of the output transistor, the rectifier preventing current flow in the primary winding from the collector electrode. The secondary winding is connected between the base electrode and the other side of the reverse bias source so that the current flow in the primary winding from the reverse bias source will induce a voltage on the secondary winding which will reverse bias the collector-base junction of the transistor.

There is also described means for selectively applying turn-on signals to the base electrode of an output transistor which includes switching means responsive to a turn-on signal to connect a turn-on source to the output transistor. The switching means is interposed between a turn-on source and the base electrode of the output transistor. A capacitance means has one end connected to the turn-on source side of the switching means and the other end of the emitter electrode of the output transistor, to enable driving the transistor means into saturation more quickly when a turn-on signal is applied to the switching means.

Other objects, features, and advantages will become apparent from the following description when taken in conjunction with the accompanying drawings, in which:

DESCRIPTION OF THE PREFERRED EMBODIMENTS

Figure 1:
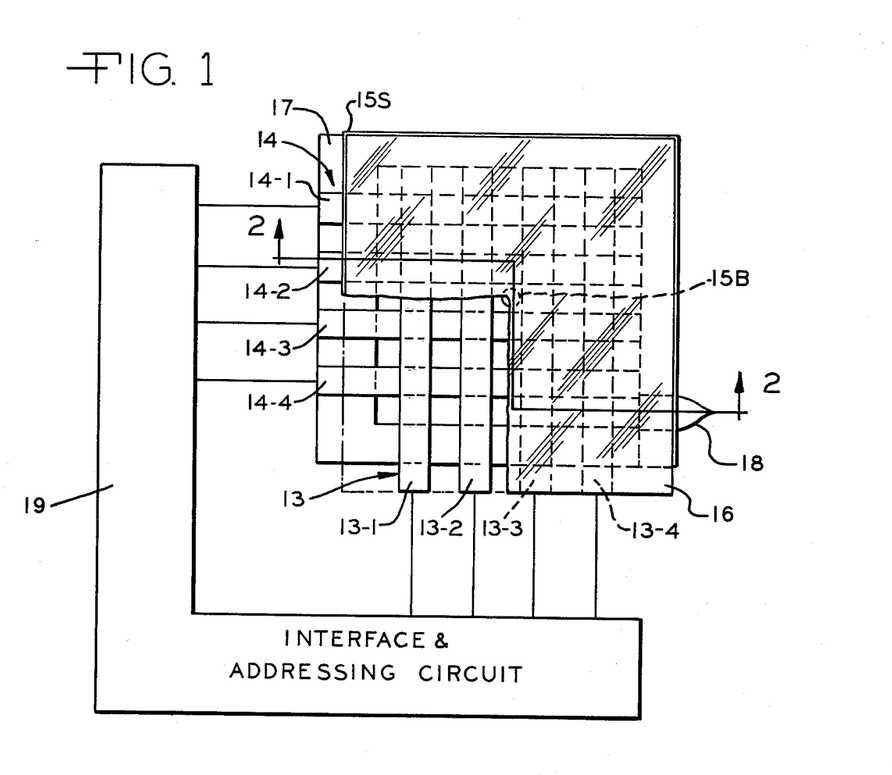
FIG. 1 is a partially cut-away plan view of a gaseous discharge display/memory panel as connected to a diagrammatically illustrated source of operating potentials.
Figure 2:
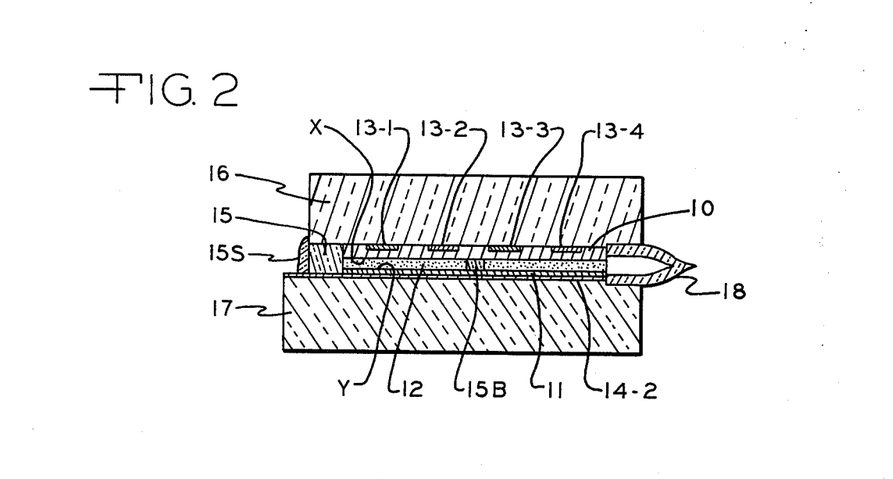
FIG. 2 is a cross-sectional view (enlarged, but not to proportional scale since the thickness of the gas volume, dielectric members and conductor arrays have been enlarged for purposes of illustration) taken on lines 2—2 of FIG. 1.

The invention utilizes a pair of dielectric films 10 and 11 shown in FIGS. 1 and 2 as separated by a thin layer or volume of a gaseous discharge medium 12, the medium 12 producing a copious supply of charges (ions and electrons) which are alternately collectable on the surfaces of the dielectric members at opposed or facing elemental or discrete areas X and Y defined by the conductor matrix on non-gas-contacting sides of the dielectric members, each dielectric member presenting large open surface areas and a plurality of pairs of elemental X and Y areas. While the electrically operative structural members such as the dielectric members 10 and 11 and conductor matrixes 13 and 14 are all relatively thin (being exaggerated in thickness in FIGS. 1 and 2) they are formed on and supported by rigid nonconductive support members 16 and 17 respectively.

Typically, one or both of nonconductive support members 16 and 17 pass light produced by discharge in the elemental gas volumes. Usually, they are transparent glass members and these members essentially define the overall thickness and strength of the panel. For example, the thickness of gas layer 12 as determined by spacer 15 is usually under 10 mils and typically about 4 to 6 mils, dielectric layers 10 and 11 (over the conductors at the elemental or discrete X and Y areas) are usually between 1 and 2 mils thick, and conductors 13 and 14 about 8,000 angstroms thick. However, support members 16 and 17 are much thicker (particularly in large panels) so as to provide as much ruggedness as may be desired to compensate for stresses in the panel. Support members 16 and 17 also serve as heat sinks for heat generated by discharges and thus minimize the effect of temperature on operation of the device. If it is desired that only the memory function be utilized, then none of the members need be transparent to light.

Except for being nonconductive or good insulators the electrical properties of support members 16 and 17 are not critical. The main function of support members 16 and 17 is to provide mechanical support and strength for the entire panel, particularly with respect to pressure differential acting on the panel and thermal shock. As noted earlier, they should have thermal expansion characteristics substantially matching the thermal expansion characteristics of dielectric layers 10 and 11. Ordinary ¼ inch commercial grade soda lime plate glasses have been used for this purpose. Other glasses such as low expansion glasses or transparent devitrified glasses can be used provided they can withstand intersections and have expansion characteristics substantially matching expansion characteristics of the dielectric coatings 10 and 11. For given pressure differentials and thickness of plates, the stress and deflection of plates may be determined by following standard stress and strain formulas (see R. J. Roark, Formulas for Stress and Strain, McGraw-Hill, 1954).

Spacer 15 may be made of the same glass material as dielectric films 10 and 11 and may be an integral rib formed on one of the dielectric members and fused to the other members to form a bakeable hermetic seal enclosing and confining the ionizable gas volume 12. However, a separate final hermetic seal may be effected by a high strength devitrified glass sealant 15S. Tubulation 18 is provided for exhausting the space between dielectric members 10 and 11 and filling that space with the volume of ionizable gas. For large panels small bead-like solder glass spacers such as shown at 15B may be located between conductor intersctions and fused to dielectric members 10 and 11 to aid in withstanding stress on the panel and maintain uniformity of thickness of gas volume 12.

Conductor arrays 13 and 14 may be formed on support members 16 and 17 by a number of well-known processes, such as photoetching, vacuum deposition, stencil screening, etc. In one embodiment, the center-to-center spacing of conductors in the respective arrays is about 17 mils. Transparent or semi-transparent conductive material such as tin oxide, gold or aluminum can be used to form the conductor arrays and should have a resistance less than about 1000 ohms per linear inch of conductor line, usually less than about 50 ohms per inch. Narrow opaque electrodes may alternately be used so that discharge light passes around the edges of the electrodes to the viewer. It is important to select a conductor material that is not attacked during processing by the dielectric material.

It will be appreciated that conductor arrays 13 and 14 may be wires or filaments of copper, gold, silver or aluminum or any other conductive metal or material. For example 1 mil wire filaments are commercially available and may be used in the invention. However, formed in situ conductor arrays are preferred since they may be more easily and uniformly placed on and adhered to the support plates 16 and 17.

Dielectric layer mambers 10 and 11 are formed of an inorganic material and are preferably formed in situ as an adherent film or coating which is not chemically or physically effected during bake-out of the panel. One such material is a solder glass such as Kimble SG-68 manufactured by and commercially available from the assignee of the present invention.

This glass has thermal expansion characteristics substantially matching the thermal expansion characteristics of certain soda-lime glasses, and can be used as the dielectric layer when the support members 16 and 17 are soda-lime glass plates. Dielectric layers 10 and 11 must be smooth and have a dielectric strength of about 1000 volts per mil and be electrically homogeneous on a microscopic scale (e.g., no cracks, bubbles, crystals, dirt, surface films, etc.) In addition, the surfaces of dielectric layers 10 and 11 should be good photoemitters of electrons in a baked-out condition. Alternatively, dielectric layers 10 and 11 may be overcoated with materials designed to produce good electron emission, as in U.S. Pat. No. 3,634,719, issued to Roger E. Ernsthausen. Of course, for an optical display at least one of dielectric layers 10 and 11 should pass light generated on discharge and be transparent or translucent and, preferably, both layers are optically transparent.

The preferred spacing between surfaces of the dielectric films is about 4 to 6 mils with conductor arrays 13 and 14 having center-to-center spacing of about 17 mils.

The ends of conductors 14-1 . . . 14-4 and support member 17 extend beyond the enclosed gas volume 12 and are exposed for the purpose of making electrical connection to interface and addressing circuitry 19. Likewise, the ends of conductors 13-1 . . . 13-4 on support member 16 extend beyond the enclosed gas volume 12 and are exposed for the purpose of making electrical connection to interface and addressing circuitry 19.

As described in detail in the Baker, et al. U.S. Pat. No. 3,499,167, the entire gas volume can be initially conditioned for subsequent operation at substantially uniform firing potentials by the use of internal or external radiation to supply free electrons throughout the gas medium 12.

Figure 3:
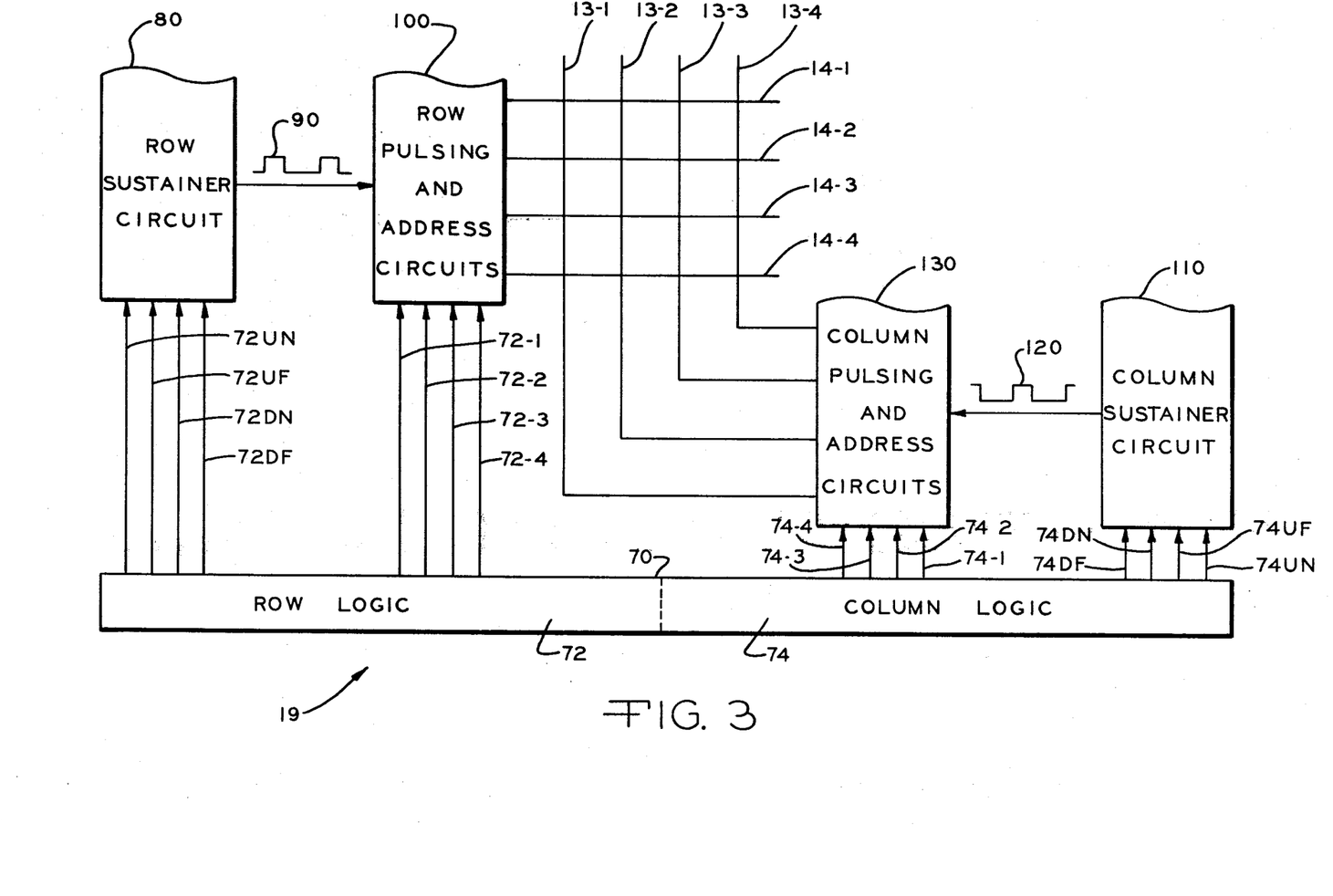
FIG. 3 is a diagrammatic layout of a system for supplying sustaining voltage for a gasous discharge display/memory panel.

Normal operation of a panel of the type described herein will be described with reference to FIGS. 1, 2, 3, and 4, the interfacing and addressing circuit indicated generally at 19 and in FIG. 1 being shown in more detail in FIG. 3. Potentials having the wave forms 90 and 120 as shown in FIG. 3 are supplied from row and column sustainer circuit generators 80, 110 via row and column pulsing and addressing circuits 100, 130 to conductor arrays 14, 13 in response to control pulses from row and column sections 72, 74, respectively of the logic control circuit 70. The resultant or composite potential wave form appearing across each cell is indicated at 140 in FIG. 4 as a periodic wave form of an alternating character. The wave form 140 is derived for the purpose of analysis of the operation of the panel by assuming that the wave forms 90 and 120 are spaced 180° apart or are oppositely phased within the cycles of the periodic composite wave form 140, and that the wave form 120 is subtracted from the wave form 90.

Figure 4:
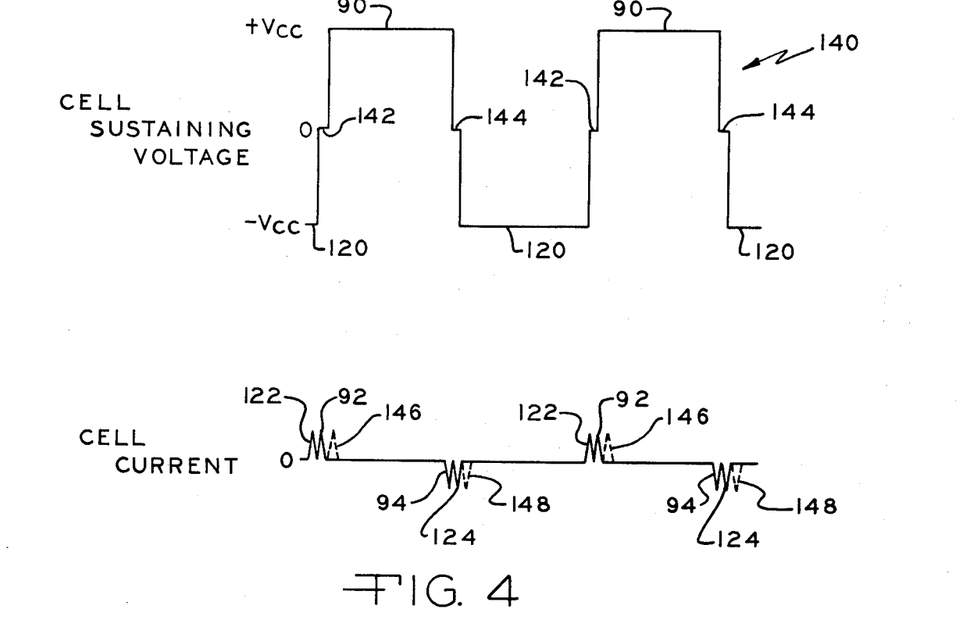
FIG. 4 is a graphical representation of cell sustaining voltage which may be supplied by the system of FIG. 3 and cell current flow in response to application of the sustaining voltage thereto and/or to gaseous discharges.

In the examples set forth in FIG. 3, the wave form 90 is a square wave with a duration of less than one-half of the cycle defined by the composite wave form 140 and with a magnitude of +Vcc as will be shown hereinafter. Thus, more than 180° of the cycle of the composite wave form 140 elapses between occurrences. The wave form 120 is a square wave with a duration of less than one-half of the cycle defined by the composite wave form 140, and with a magnitude of +Vcc, since the sustainer 110 may be idential to the sustainer 80. The logic inputs to the sustainers 80 and 110 are phased 180° apart with respect to the cycle of wave form 140. Therefore, the positive wave 120 is produced when the positive wave 90 is not being produced. When the positive wave form 120 is subtracted from the positive wave form 90, the wave form 120 appears to be negative in the composite wave form 140.

The voltage 90 from sustainer 80 constitutes approximately one-half of the sustaining voltage necessary to operate the panel, the remaining one-half which is necessary being supplied by voltage 120 phased 180° as noted above with respect to the voltage 90. Thus, one-half of the sustainer potential 140 is applied to each of the row conductors 14 and one-half of the sustainer potential 140 is applied to each of the column conductors 13. The sustainer circuits 80 and 110 advantageously have a common ground so that the panel 10 floats with respect to ground.

Individual cells or discharge sites located by the crossing of selected conductors or conductor arrays 14, 13 are manipulated by adding unidirectional voltage pulses at the proper time to each of the sustaining voltages on the selected conductors, which, when combined, are sufficient to exceed the firing potential for the selected cells and to initiate a sequence of discharges, one for each half-cycle of the applied composite sustaining potential 140. By also properly timing such unidirectional voltage pulses and applying them at a different portion in a cycle of the composite sustaining potential 140 to each of the sustaining voltages on the selected conductors, the sequence of discharges may be terminated. Thus, any individual discharge site may be manipulated "ON" or "OFF", by manipulation of the times of occurrences of the unidirectional voltage pulses.

The unidirectional voltage pulses are added to the sustainer voltages 90, 120 on the selected conductors by the row and column pulsing and addressing circuits 100, 130 in response to logic signals from the logic control circuit 70 via leads 72-1 through 72-4 and 74-1 through 74-4, respectively, to select the conductor pairs for the individual cells.

Referring again to FIG. 4, it will be noted that between the positive half-cycles 90 and the negative half-cycles 120 of the composite wave form 140 there are provided plateaus 142, 144 at the apparent zero voltage level indicating a brief time interval between the cessation of the generation of one-half cycle of the wave form 140 and the initiation of the other half-cycle of the wave form 140. These plateaus 142, 144 may be provided to reduce interference between operation of various circuits for reasons that need not be detailed here.

However, the plateaus 142, 144 provide an opportunity to more clearly show what happens as the composite sustaining voltage 140 periodically alternates between the opposite polarities derived by subtracting the wave form 120 from the wave form 90. Referring to the graphical representation of cell current flow, shown in FIG. 4 in a timed relationship with the composite wave form 140, it can be seen that as the wave form goes from the negative level of the subtracted wave form 120 to the zero level a cell displacement current flow occurs and is indicated by the positive current spikes 122. As the wave form 140 goes from the zero level to its positive level 90, a second cell displacement current flow occurs and is indicated by the positive current spikes 92.

Similarly, as the wave form 140 goes from the positive level 90 to the zero level, a negative current spike 94 occurs. As the wave form 140 goes from zero to the negative level of the subtracted wave form 120 to negative current spike 124 occurs.

Obviously, if separation plateaus 142 and 144 are not provided then the spikes 122, 92 and 94, 124 would occur at substantially the same time and a single resultant larger current spike would occur when the composite wave form 140 reverses polarity.

If the cell in question has been manipulated to an "ON" condition as hereinbefore described then the cell will discharge when the difference between the wall voltage built up from a previous discharge and the sustainer potential exceeds the firing potential necessary to discharge the cell. There then occurs a cell discharge current flow, indicated as current spikes 146, 148 shown in dotted lines in FIG. 4.

It is desirable that the cell not see any appreciable voltage change in the sustainer wave form during the discharge period, since this may interfere with the transfer of wall charge during the discharge, so that subsequent discharges every half-cycle of the sustainer wave form will continue to occur in a manner to maintain the cell "ON" in the condition required.

Row and column sustainer circuits 80, 110 are advantageously constructed using power transistors as output devices. It is desirable to be able to turn the power transistors "ON" and "OFF" as quickly as possible so that the transition slope in the wave form controlled by the power transistors is as steep as possible. To turn a power transistor "ON" quickly it is necessary to drive it with a comparatively large current pulse which will drive the transistor into deep saturation. The further the transistor is driven into saturation the smaller the internal resistance will be to the power output circuit it is controlling. If driven sufficiently far into saturation the displacement and discharge currents of FIG. 4 may flow freely through the transistor and there will be very little voltage drop across the transistor during the time the cell is discharging. Therefore, this voltage drop will make very little change as a subtraction to the composite sustainer wave form, and will not appreciably affect the transfer of wall charges during the discharge cycle of a cell.

Difficulties have been encountered, however, in that when the transistor is driven into deep saturation to reduce the wave form alteration to and below a desired level, it takes a longer time to turn the transistor "OFF". This decreases the slope of the wave form being produced and may delay or slow a voltage transition to a point which will interfere with proper panel operation. It also causes an excessive power loss, which can lead to component degradation due to unnecessary heating.

A diode clamping network has been used in the past to overcome the above-discussed problem. In one embodiment a single diode is connected to conduct in a forward direction from a clamping bias junction to the collector electrode of a power transistor connected to a voltage being controlled. Two diodes in series are connected to conduct in a forward direction from the clamping bias junction to the base electrode of the transistor. The emitter electrode may be connected through a resistor to the base electrode.

said secondary operation, the just-discussed circuit receives a turn-on pulse having a large magnitude to drive the transistor toward deep saturation, changing the configuration of the wave form being controlled and permitting the free flow therethrough of the displacement current and discharge current, if any, from the panel being controlled. Since the transistor is going toward deep saturation the resistance offered thereby to the discharge current results only in a voltage change in the composite sustaining form which is below a level which would significantly interfere with the transfer of the wall charges in any cells in the panel which are "ON".

If, in the embodiment of the diode clamping circuit being discussed, the collector electrode is connected to an output voltage source being controlled, when the flow of displacement and discharge current ceases there is no load on the transistor and if the transistor is still being driven hard, then deep saturation will occur because the collector voltage is lower than the base voltage.

To bring or keep the transistor out of deep saturation the collector voltage is increased or maintained just above the base voltage by the diode clamping circuit. The diode between the collector and the clamping bias junction is required to isolate the voltage wave form being controlled from the base of the transistor. If the transistor requires a V voltage drop across the base-emitter junction (and the resistor connecting the base and emitter electrodes) to turn it "on" then the isolating diode means is selected to have a voltage drop in the forward direction in response to current flow through the clamping bias junction which is less than the voltage drop in the forward direction of the serially connected base diode means plus the voltage drop across the base-emitter resistor in response to current flow through the clamping bias junction.

Thus, if the isolating diode and any resistance associated therewith has a voltage drop thereacross which is less than the clamping bias voltage necessary at the clamping bias junction to keep the transistor "on", then the collector voltage is equal to the clamping bias voltage minus the isolating diode voltage drop and is therefore larger than the base voltage. The transistor is kept out of saturation and turns off when the drive pulse is removed and stops conducting relatively quickly.

The clamping bias voltage is preferably applied to the clamping bias junction at the same time that the drive pulse is removed from the base of the transistor.

While the just-described diode clamping circuit has worked well in some applications, it is desirable to be able to turn the power transistor "off" even more quickly in certain applications. It is also desirable to be able to use power transistors which have longer storage times (the length of time a transistor stays in saturation without a driving potential applied) since the longer storage time transistors are less expensive. It is further desirable to be able to saturate the power transistor as much as possible, without interfering with the ability to turn the transistor "off" quickly, to reduce the internal resistance even further than reduced with the diode clamping circuit, so that the voltage drop across the transistor during flow of cell discharge current is as low as possible.

Figure 5:
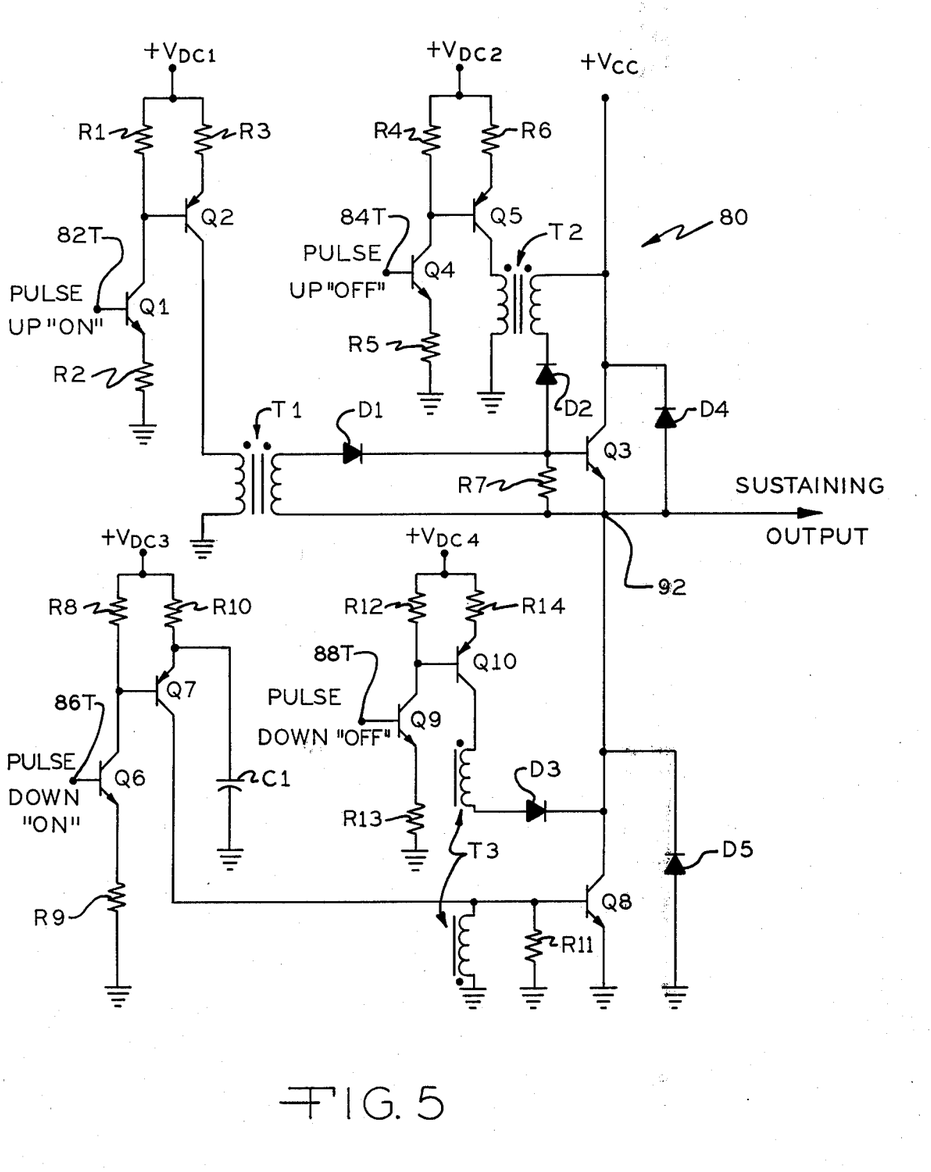
FIG. 5 is a schematic diagram of a circuit embodying the teachings of this invention for supplying sustaining voltage to the row conductors of the panel.
Figure 6:
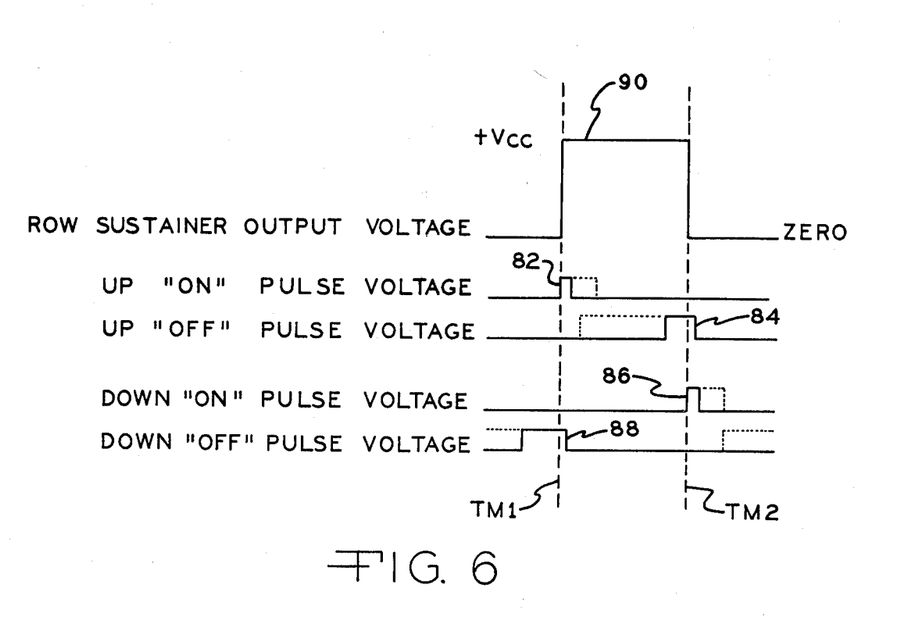
FIG. 6 is a graphical representation of the sustaining voltage supplied by the apparatus of FIG. 5 in response to the graphically represented input pulses from the row logic circuits.

Referring now to FIG. 5 there is illustrated in detail a schematic diagram of a circuit which may be used as the sustainer wave form generator 80 to produce the wave form 90 as shown in FIGS. 3 and 6. As noted hereinbefore, an identical circuit may be used to produce the wave form 120.

A first power transistor Q3 is connected between a source of sustainer potential +Vcc and an output terminal 92 of the sustainer generator 80. A second power transistor Q8 is connected between the output terminal 92 and ground. When the transistor Q3 is turned "on" the transistor Q8 is turned "off", and vice versa. Thus when the transistor Q3 is turned "on" the voltage at the output terminal 92 rises to the value of the potential +Vcc as shown in FIG. 6. When the transistor Q3 is turned "off" and the transistor Q8 is turned "on", the voltage falls from the magnitude of the +Vcc potential to ground, as also indicated in FIG. 6.

A circuit for turning the transistor Q3 "on" includes a transistor Q1 having its emitter connected through resistor R2 to ground, and its collector connected through resistor R1 to a potential +Vdc1 and also to the base electrode of a transistor Q2. The emitter electrode of transistor Q2 is connected through a resistor R3 to the potential +Vdc1 while the collector of the transistor Q2 is connected through a primary winding of a transformer T1 to ground. The secondary winding of the transformer T1 is connected through an isolating diode D1 across a base emitter resistor R7. A circuit for turning off the transistor Q3 includes a transistor Q4 having its emitter connected through a resistor R5 to ground, and its collector connected through a resistor R4 to a potential +Vdc2 and also connected to the base of a transistor Q5. The emitter of the transistor Q5 is connected through a resistor R6 to the potential +Vdc2 while the collector is connected through a primary winding of a transformer T2 to ground. The secondary winding of the transformer T2 has one end connected to the collector electrode of the power transistor Q3 and the other end connected through an isolating diode D1 to the base electrode of the transistor Q3.

A circuit for turning the power transistor Q8 "on" includes a transistor Q6 having its emitter connected through a resistor R9 to ground, and its collector connected through a resistor R8 to potential +Vdc3 and also to the base electrode of a transistor Q7. The emitter electrode of the transistor Q7 is connected through a resistor R10 to the potential +Vdc3 and also through a driving capacitor C1 to ground. The collector electrode of the transistor Q7 is connected through the resistor R11 to ground. The resistor R11 is thus connected between the base and the emitter of the power transistor Q8. The base electrode of the power transistor Q8 is also connected through a secondary winding of a transformer T3 to ground.

A circuit for turning off the transistor Q8 includes a transistor Q9 having its emitter connected through a resistor R13 to ground, and its collector connected through a resistor R12 to a potential +Vdc4 and also to a base electrode of the transistor Q10. The emitter of the transistor Q10 is connected through a resistance R14 to the potential +Vdc4 and the collector is connected through the primary winding of a transformer T3 and an isolating diode D3 to the collector of the transistor Q8.

A bypass diode D4 is connected around the emitter-collector electrodes of the transistor Q3 to permit current flow to the panel when the column sustainer circuit 110 is operative to provide the wave form 120 and for the flow of any of the displacement and any discharge currents that may be involved as the result thereof. Similarly, a bypass diode D5 is connected around the emitter-collector electrodes of the power transistor Q8.

In operation, a short duration turn-on pulse 82 (see FIG. 6) is applied to terminal 82T on the base of the transistor Q1 from the logic control 70 via the lead 74 UN (see FIG. 3) to turn the transistor Q1 "on", thereby also turning the transistor Q2 "on" and permitting current flow through the primary winding of the transformer T1. A drive pulse is induced on the secondary winding of the transformer T1 causing current flow through the diode D1 and the resistor R7 to turn the power transistor Q3 "on". The driving pulse induced in the secondary of the transformer T1 is of sufficient magnitude to drive the power transistor Q3 very hard to bring the output terminal 92 to the voltage level +Vcc as indicated in FIG. 6, and also leaves the power transistor Q3 saturated.

Any time after the panel displacement and discharge current flow are, for the most part, over the pull-up turn-off pulse 84 (FIG. 6) is applied to terminal 84T connected to the base electrode of the transistor Q4 via the lead 74 UF from the logic circuit 70. The pulse 84 causes the transistor Q4 to conduct, which, in turn, causes the transistor Q5 to conduct and provide a current flow in the primary winding of the transformer T2. Current flow is induced in the secondary winding of the transformer T2 causing a potential to be provided between the collector of Q3 and the base thereof which is higher at the collector than at the base. The minority carriers of the saturated collector-base junction of the power transistor Q3 are discharged through the diode D2. The transformer-diode circuit just described turns the power transistor Q3 "off" very quickly allowing negative panel-address pulses to also be applied quickly to the sustainer wave form 90, which is a requirement in some addressing circuit schemes or techniques. As shown by the vertical dashed time line TM1 the pulses 82 and 88 in FIG. 6 may be overlapped. The circuit is most advantageously utilized when the pull-up turn-on pulse 82 and pull-down turn-off pulse 88 overlap to assist in eliminating current spiking of the power transistor Q8 when the second power transistor Q3 is turned "on".

When the voltage is to be dropped at the output terminal 92 from the level of the potential +Vcc to ground or zero as illustrated in FIG. 6, a short duration pull-down turn-on pulse 86 is applied to the terminal 86T connected to the base of the transistor Q6 via the lead 74DN from the logic circuit 70. This turns the transistor Q6 "on" allowing conduction through the emitter-collector circuit thereby also turning the transistor Q7 "on". The bypass capacitor C1 enables bypassing of the emitter of the transistor Q7 and application of the driving pulse to the base-emitter circuit of the power transistor Q8 turning it "on" very quickly and deeply saturating the transistor. This reduces the voltage at the terminal 92 to ground level providing the zero output from the sustainer circuit 80 as noted in FIG. 6.

The capacitor C1 is used in the pull-down driving circuit only, in this instance, because discharge current will immediately follow the pull-down transition of either Q3 or Q8 and the pull-down transistor Q8 has very little time to become saturated. So, the transistor Q8 requires a harder drive than the pull-up transistor Q3 which will have the time provided by the plateau 142 to be driven deeply into saturation before it will have to pass discharge current after it is turned "on".

Some systems do require that the pull-up transition cause a discharge, and so may use a bypass capacitor around Q2. Alternatively, or in addition to the use of bypass capacitors, the value of the resistance of the resistors R10 and/or R3 may be varied to vary the drive applied to transistors Q8 and/or Q3.

Any time after panel displacement and discharge current flow through the transistor Q8 is, for the most part, over the pull-down turn-off pulse 88 may be applied to terminal 88T connected to the base of the transistor Q9 via the lead 74DF from the logic circuit 70. The transistor Q9 conducts causing the transistor Q10 to conduct and allow current flow through the primary winding of the transformer T3 and the isolating diode D3 to the collector of the power transistor Q8. This applies a potential to the collector of the power transistor Q8. Current flow is also induced in the secondary winding of the transformer T3 which is connected to the base electrode of the power transistor Q8. The developed potentials allows current to flow through the primary winding of the transformer T3, the isolating diode D3, the saturated collector-base junction of the power transistor Q8, and the secondary winding of the transformer T3 to ground, discharging the minority carriers from the saturated collector-base junction, and turning off the power transistor Q8 very quickly. Again, the pull-down turn-on pulse 86 is advantageously applied as noted by the dashed time line TM2 in FIG. 6 so that the pulse 86 and the pull-up turn-off pulse 84 overlap to reduce the current spiking effects on the power transistor Q3 when the power transistor Q8 is turned on.

The dotted line extensions of the pulses 82, 84, 86, and 88 in FIG. 6 denote the leeway as to when the pulses may be applied. For example, if the pull-up turn-on pulse 82 is a harder, more driving pulse in a particular application, it may be desirable to apply the pull-up turn-off pulse 84 more quickly to provide a longer time to bring the transistor Q3 out of saturation.

It should be noted that there will be no significant current flow through the secondary windings of the transformers T2 and T3 from the driving pulses for the transistors Q3 and Q8, respectively, since there is no current flow through the primary windings of these transformers until the turn-off pulses are applied. Therefore, a high impedance will be reflected to the secondary windings and the driving current will flow through the bases of the transistors Q3 and Q8 and the resistors R7 and R11, respectively.

It should be noted that a mirror image type modification of the circuit illustrated in FIG. 5 may be constructed to produce the negative pulse outputs 90 and 120. That is, the signal, bias, and supply voltages would have opposite polarities, while P-N-P type transistors would be substituted for N-P-N type transistors (and vice versa), and the connections of the diodes and the transformers of the clamping circuits would be reversed where necessary to enable the reverse biasing of saturated collector-base junctions to bring the clamped transistors out of saturation at a desired time.

Phasing of the negative logic signals from section 74 of unit 70 on leads 74UN, 74UF, 74DN, and 74DF with 180° spacings in a composite wave form cycle with respect to the negative logic signals 72UF, 72UN, 72DN, and 72DF would also be obvious to obtain the resultant or composite cell sustainer voltage wave form illustrated in FIG. 4.

It should also be noted that combinations of positive and negative sustainer wave form generator circuits may be used in certain applications.

There have thus been described and disclosed transformer-diode clamping circuits which may be used to turn-off output power transistors after very heavy turn-on drive pulses, enabling the power transistors to be turned off in a fraction of the normal storage time for the devices. This enables a sustainer performance to meet and match the very fast switching speed and high current requirements of newly developed display/memory panels, as well as prior art panels. The very fast, high voltage, high current switching of the apparatus disclosed herein far outperforms the present prior art devices. The turn-on and turn-off pulse scheme permits greater flexibility in unique logic address requirements.

What is claimed is:

1. In a system for supplying operating potential to a load device wherein at least two conductors are dielectrically isolated from a gas discharge medium between said conductors, comprising
 a. voltage wave form generating means having an output means adapted to be connected to a conductor;
 b. said wave form generating means including at least two sections, a first of said sections being operative to connect a first potential level to said output means while a second of said sections is operative to connect a second potential level to said output means;

c. each of said output sections including at least one output transistor means operating as a switching means between its respective potential level and said output means of said wave form generating means, each said transistor means having collector, base and emitter electrodes and collector-base and emitter-base junctions;

d. means for selectively applying turn-on signals to the emitter base junctions of each of said output transistor means, said signals being sufficient in magnitude to drive each of said output transistor means into saturation;

e. means for selectively applying turn-off signals to each of said output transistor means;

f. means responsive to said turn-off signals for selectively establishing current flow through said collector-base junction of each of said output transistor means to reverse bias said collector-base junction to enable each of said output transistors to turn off quickly; and g. means for coordinating the application of said turn-on and turn-off signals so that a turn-off signal for one section will overlap in time a turn-on signal for the other section to prevent current spiking of the output transistor means being turned off.

2. A system as defined in claim 1 in which a. at least one of said reverse bias establishing means for one of said output transistor means includes a transformer having primary and secondary windings, an isolating rectifier means, and means for connecting a reverse bias source to said primary winding of said transformer, b. secondary winding being connected in a circuit across said collector-base junction of said one output transistor means with said isolating rectifier means, said isolating rectifier means being connected to prevent current flow between said collector electrode and said base electrode of said one output transistor means through said secondary winding of said transformer in response to collector potentials that would establish a forward bias across said emitter-base junction, c. said primary winding being connected to receive current from a reverse bias source which will induce a potential on said secondary winding which will cause current flow through said isolating rectifier in a forward direction and through said collector-base junction of said one output transistor means in a direction to reverse bias said collector-base junction and discharge the minority carriers from the saturated junction to enable said transistor to turn off quickly.

3. A system as defined in claim 1 in which at least one of said reverse bias establishing means for one of said output transistor means includes a. a transformer having primary and secondary windings, b. an isolating rectifier means, and c. means responsive to a turn-off signal for connecting a reverse bias source to said primary winding of said transformer, d. said secondary winding being connected between said collector and base electrodes of said one output transistor means via said isolating rectifier means, which is connected to prevent current flow in said secondary winding from said collector electrode to said base electrodes, so that current flow in said primary winding will induce a voltage on said secondary winding which will reverse bias said collector-base junction.

4. A system as defined in claim 1 in which at least one of said reverse bias establishing means for one of said output transistor means includes a. a transformer having primary and secondary windings, b. an isolating rectifier means, and c. means responsive to a turn-off signal for connecting a reverse bias source to said primary winding of said transformer, d. said primary winding being connected between the side of said source connecting means opposite from one side of the reverse bias source via said isolating rectifier means to the collector electrode of said one output transistor means, said rectifier means preventing current flow in said primary winding from said collector electrode, e. said secondary winding being connected between the base electrode and the other side of the reverse bias source so that current flow in said primary winding from said reverse bias source will induce a voltage on said secondary winding which will reverse bias the collector-base junction of said one output transistor means.

5. A system as defined in claim 1 in which said means for selectively applying turn-on signals to the base electrode of at least one said output transistor includes a. switching means responsive to a turn-on signal to connect a turn-on source to said output transistor means interposed between a turn-on source and the base electrode of said one output transistor means, and b. capacitance means connected at one end to the turn-on source side of said switching means and at the other end to said emitter electrode of said one output transistor means to enable driving said transistor means into saturation more quickly when a turn-on signal is applied to said switching means.

6. In a system for supplying operating potential to a load device wherein at least two conductors are dielectrically isolated from a gas discharge medium between said conductors, comprising a. voltage wave form generating means having an output means adapted to be connected to a conductor;

b. said wave form generating means including at least two sections, a first of said sections being operative to connect a first potential level to said output means while a second of said sections is operative to connect a second potential level to said output means;

c. each of said output sections including at least one output transistor means operating as a switching means between its respective potential level and said output means of said wave form generating means, each said transistor means having collector, base and emitter electrodes and a collector-base junction;

d. means for selectively applying turn-on signals to the base electrodes of each of said output transistor means, said signals being sufficient in magnitude to drive each of said output transistor means into saturation;

e. means for selectively applying turn-off signals to each of said output transistor means; and f. means responsive to said turn-off signals for selectively establishing current flow through said collector-base junction of each of said output transistor means to reverse bias said collector-base junction to enable each of said output transistors to turn off quickly;

g. at least one of said reverse bias establishing means for one of said output transistor means including a transformer having primary and secondary windings, an isolating rectifier means, and means responsive to a turn-off signal for connecting a reverse bias source to said primary winding of said transformer;

h. said secondary winding being connected between said collector and base electrodes of said one output transistor means via said isolating rectifier means, which is connected to prevent current flow in said secondary winding from said collector electrode to said base electrode, so that current flow in said primary winding will induce a voltage on said secondary winding which will reverse bias said collector-base junction.

7. In a system for supplying operating potential to a load device wherein at least two transversely oriented conductors are dielectrically isolated from a gas discharge medium between said conductors, comprising a. voltage wave form generating means having an output means adapted to be connected to a transverse conductor;

b. said wave form generating means including at least two sections, a first of said sections being operative to connect a first potential level to said output means while a second of said sections is operative to connect a second potential level to said output means;

c. each of said output sections including at least one output transistor means operating as a switching means between its respective potential level and said output means of said wave form generating means, each said transistor means having collector, base and emitter electrodes and a collector-base junction;

d. means for selectively applying turn-on signals to the base electrodes of each of said output transistor means, said signals being sufficient in magnitude to drive each of said output transistor means into saturation;

e. means for selectively applying turn-off signals to each of said output transistor means; and f. means responsive to said turn-off signals for selectively establishing current flow through said collector-base junction of each of said output transistor means to reverse bias said collector-base junction to enable each of said output transistors to turn off quickly;

g. at least one of said reverse bias establishing means for one of said output transistor means including a transformer having primary and secondary windings, an isolating rectifier means, and means responsive to a turn-off signal for connecting a reverse bias source to said primary winding of said transformer;

h. said primary winding being connected between the side of said source connecting means opposite from one side of the reverse bias source via said isolating rectifier means to the collector electrode of said one output transistor means, said rectifier means preventing current flow in said primary winding from said collector electrode;

i. said secondary winding being connected between the base electrode and the other side of the reverse bias source so that current flow in said primary winding from said reverse bias source will induce a voltage on said secondary winding which will reverse bias the collector-base junction of said one output transistor means.

8. In a system for supplying operating potential to a load device wherein at least two transversely oriented conductors are dielectrically isolated from a gas discharge medium between said conductors, comprising a. voltage wave form generating means having an output means connected to a transverse conductor;

b. said wave form generating means including at least two sections, a first of said sections being operative to connect a first potential level to said output means while a second of said sections is operative to connect a second potential level to said output means;

c. each of said output sections including at least one output transistor means operating as a switching means between its respective potential level and said output means of said wave form generating means;

d. means for selectively applying turn-on signals to each of said output transistor means;

e. means for selectively applying turn-off signals to each of said output transistor means; and f. means for coordinating the application of said turn-on and turn-off signals so that a turn-off signal for one section will overlap in time a turn-on signal for the other section to prevent current spiking of the output transistor means being turned off.

9. In a system for supplying operating potential to a load device wherein at least two transversely oriented conductors are dielectrically isolated from a gas discharge medium between said two conductors, comprising a. voltage wave form generating means connected to a transverse conductor;

b. said wave form generating means including at least one transistor means operating as a switching means between an operating potential and a transverse conductor, said transistor means having collector, base and emitter electrodes with collector-base and base-emitter junctions;

c. means for applying a turn-on signal to said base emitter junction having a magnitude sufficient to turn said transistor on and drive said transistor into a saturated condition; and d. means for selectively establishing current flow through said collector-base junction to reverse bias said junction;

e. said reverse bias establishing means including a transformer having primary and secondary windings, an isolating rectifier means, and means for connecting a reverse bias source to said primary winding of said transformer;

f. said secondary winding being connected between said collector and base electrodes of said one transistor means via said isolating rectifier means, which is connected to prevent current flow in said secondary winding from said collector electrode to said base electrode, so that current flow in said primary winding will induce a voltage on said secondary winding which will reverse bias said collector-base junction.

10. In a system for supplying operating potential to a load device wherein at least two transversely oriented conductors are dielectrically isolated from a gas discharge medium between said two conductors, comprising
   a. voltage wave form generating means connected to a transverse conductor;
   b. said wave form generating means including at least one transistor means operating as a switching means between an operating potential and a transverse conductor, said transistor means having collector, base and emitter electrodes with collector-base and base-emitter junctions;
   c. means for applying a turn-on signal to said base emitter junction having a magnitude sufficient to turn said transistor on and drive said transistor into a saturated condition; and
   d. means for selectively establishing current flow through said collector-base junction to reverse bias said junction;
   e. said reverse bias establishing means including a transformer having primary and secondary windings, an isolating rectifier means, and means for connecting a reverse bias source to said primary winding of said transformer;
   f. said primary winding being connected between the side of said source connecting means opposite from one side of the reverse bias source via said isolating rectifier means to the collector electrode of said transistor means, said rectifier means preventing current flow in said primary winding from said collector electrode;
   g. said secondary winding being connected between the base electrode and the other side of the reverse bias source so that current flow in said primary winding from said reverse bias source will induce a voltage on said secondary winding which will reverse bias the collector-base junction of said transistor means.

11. Control apparatus, comprising
   a. transistor means having collector, base, and emitter electrodes with collector-base and base-emitter junctions between said electrodes;
   b. means for connecting a turn-on source to provide a driving signal to said base emitter junction having a magnitude sufficient to turn said transistor on and drive transistor into a saturated condition; and
   c. means for selectively establishing current flow through said collector-base junction to reverse bias said junction to enable said transistor to turn off quickly;
   d. said reverse bias establishing means including a transformer having primary and secondary windings, an isolating rectifier means, and means for connecting a reverse bias source to said primary winding;
   e. said secondary winding being connected between said collector and base electrodes of said one output transistor means via said isolating rectifier means, which is connected to prevent current flow in said secondary winding from said collector electrode to said base electrode, so that current flow in said primary winding will induce a voltage on said secondary winding which will reverse bias said collector-base junction.

12. Control apparatus, comprising
   a. transistor means having collector, base, and emitter electrodes with collector-base and base-emitter junctions between said electrodes;
   b. means for connecting a turn-on source to provide a driving signal to said base emitter junction having a magnitude sufficient to turn said transistor on and drive said transistor into a saturated condition; and
   c. means for selectively establishing current flow through said collector-base junction to reverse bias said junction to enable said transistor to turn off quickly;
   d. said reverse bias establishing means including a transformer having primary and secondary windings, an isolating rectifier means, and means for connecting a reverse bias source to said primary winding;
   e. said primary winding being connected between the side of said source connecting means opposite from one side of the reverse bias source via said isolating rectifier means to the collector electrode of said one output transistor means, said rectifier means preventing current flow in said primary winding from said collector electrode;
   f. said secondary winding being connected between the base electrode and the other side of the reverse bias source so that current flow in said primary winding from said reverse bias source will induce a voltage on said secondary winding which will reverse bias the collector-base junction of said one output transistor means.

* * * * *